(12) United States Patent
Wu

(10) Patent No.: US 12,133,429 B2
(45) Date of Patent: Oct. 29, 2024

(54) DISPLAY PANEL AND DISPLAY DEVICE

(71) Applicant: Wuhan China Star Optoelectronics Semiconductor Display Technology Co., Ltd., Hubei (CN)

(72) Inventor: Xing Wu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/764,557

(22) PCT Filed: Mar. 22, 2022

(86) PCT No.: PCT/CN2022/082256
§ 371 (c)(1),
(2) Date: Mar. 29, 2022

(87) PCT Pub. No.: WO2023/168754
PCT Pub. Date: Sep. 14, 2023

(65) Prior Publication Data
US 2024/0074252 A1    Feb. 29, 2024

(30) Foreign Application Priority Data

Mar. 11, 2022  (CN) .......................... 202210237733.1

(51) Int. Cl.
*H10K 59/126*  (2023.01)
*H10K 59/131*  (2023.01)
*G09G 3/3225*  (2016.01)

(52) U.S. Cl.
CPC ......... *H10K 59/126* (2023.02); *H10K 59/131* (2023.02); *G09G 3/3225* (2013.01); *G09G 2300/0408* (2013.01)

(58) Field of Classification Search
CPC .............. H10K 59/126; H10K 59/131; H10K 59/1213; H01L 23/60; G09G 3/3225; G09G 2300/0408
See application file for complete search history.

(56) References Cited

U.S. PATENT DOCUMENTS

| 2021/0134846 A1 | 5/2021 | Tai | |
| 2022/0157919 A1* | 5/2022 | Tian | ..................... H10K 59/126 |
| 2023/0122411 A1* | 4/2023 | Yuan | .................. H10K 59/1216 345/206 |

FOREIGN PATENT DOCUMENTS

| CN | 105321957 | 2/2016 |
| CN | 112310044 | 2/2021 |

(Continued)

OTHER PUBLICATIONS

International Search Report and the Written Opinion Dated Nov. 30, 2022 From the International Searching Authority Re. Application No. PCT/CN2022/082256 and Its Translation Into English. (17 Pages).

*Primary Examiner* — Thanh Y. Tran

(57) ABSTRACT

A display panel and a display device are provided. The display panel includes a shielding layer, a pixel driving circuit layer located on the shielding layer and including a plurality of pixel driving circuits at least partially overlapping the shielding layer, and a power supply line electrically connected to a plurality of through holes of the shielding layer disposed in the pixel driving circuit layer. A converging line between adjacent through holes are arranged according to a shortest distance between the adjacent through holes.

20 Claims, 5 Drawing Sheets

(56) References Cited

FOREIGN PATENT DOCUMENTS

| CN | 112670304 | 4/2021 |
| CN | 113826210 | 12/2021 |
| CN | 113871420 | 12/2021 |

* cited by examiner

DISPLAY PANEL AND DISPLAY DEVICE

RELATED APPLICATIONS

This application is a National Phase of PCT Patent Application No. PCT/CN2022/082256 having International filing date of Mar. 22, 2022, which claims the benefit of priority of Chinese Patent Application No. 202210237733.1 filed on Mar. 11, 2022. The contents of the above applications are all incorporated by reference as if fully set forth herein in their entirety.

FIELD AND BACKGROUND OF THE INVENTION

The present disclosure relates to the field of display technologies, and more particularly, to a display panel and a display device.

BACKGROUND

Organic light-emitting diode (OLED) screens are currently widely used and have advantages of light weight and high color gamut value. However, since substrates, adopting organic flexible substrates, are affected by interfaces between the substrates and inorganic layers, the OLED screens are prone to have problems such as screen afterimages, initial drops, and poor service life.

In order to reduce such influence, more and more of the OLED screens adopt bottom shielding metals to shield pixel driving circuits at the interfaces between the substrates and the inorganic layers. However, in order to link to power supply lines, the bottom shielding metals have serrated edges, and electro-static discharge (ESD) explosions are likely to occur at tips of serrations, thereby affecting a display effect.

SUMMARY OF THE INVENTION

The present invention provides a display panel and a display device, which can reduce a problem of electro-static discharge (ESD) damage to bottom shielding metals.

Therefore, the present invention provides a display panel including a display region and a non-display region disposed on at least one side of the display region. The display panel includes: a substrate; a shielding layer located on the substrate and including a plurality of shielding blocks and a converging wire electrically connected to the plurality of shielding blocks, and the converging wire being located on at least one side of the plurality of shielding blocks; a pixel driving circuit layer located on the shielding layer and including a plurality of pixel driving circuits located in the display region, each of the plurality of pixel driving circuits at least partially overlapping a corresponding one of the shielding blocks; and a plurality of power supply lines disposed on a side of the shielding layer away from the substrate. The plurality of power supply lines are electrically connected to the converging wire through a plurality of through holes. The converging wire between two adjacent ones of the plurality of through holes is disposed according to a shortest distance between the two adjacent through holes.

In some embodiments, the converging wire between the two adjacent through holes is linear in arrangement.

In some embodiments, the converging wire is linear in arrangement and the plurality of through holes overlappingly disposed on the converging wire are linear in arrangement.

In some embodiments, the converging wire includes a first converging wire, and the first converging wire includes a plurality of first connection sections and a plurality of second connection sections; wherein each of the plurality of second connection sections is connected between a middle portion of two adjacent first plurality of connection sections, a width of the plurality of first connection sections is greater than a width of the plurality of second connection sections, and the plurality of power supply lines are electrically connected to the plurality of first connection sections through the plurality of through holes.

In some embodiments, the pixel driving circuit layer includes the plurality of pixel driving circuits arranged in an array in a first direction and a second direction, each of the plurality of first connection sections is electrically connected to the plurality of shielding blocks corresponding to a column of the plurality of pixel driving circuits arranged along a first direction.

In some embodiments, a periphery of the plurality of first sections is arc shaped, the plurality of second sections are linearly shaped, a maximum width of the plurality of first sections is greater than the width of the plurality of second sections.

In some embodiments, the non-display region includes: a first non-display region and a second non-display region disposed on two sides of the display region, wherein the first non-display region includes a bending sub-region, and the display panel bends at the bending sub-region.

The converging wire includes a first converging wire arranged in the first non-display region, and the plurality of power supply lines are electrically connected to the plurality of first connection sections at least through the plurality of through holes.

In some embodiments, the converging wire includes a second converging wire arranged in the second non-display region, and the plurality of power supply lines are further electrically connected to the plurality of second connection sections through the plurality of through holes.

In some embodiments, the pixel driving circuit layer includes: a semiconductor layer disposed on a side of the shielding layer away from the substrate; a first insulating layer disposed on a side of the semiconductor layer away from the substrate; a first gate metal layer disposed on a side of the first insulating layer away from the substrate; a second insulating layer disposed on a side of the first gate metal layer away from the substrate; a second gate metal layer disposed on a side of the second insulating layer away from the substrate; and a third insulating layer disposed on a side of the second gate metal layer away from the substrate. The first conductive layer is disposed on a side of the third insulating layer away from the substrate, the plurality of power supply lines of the first conductive layer are electrically connected to the converging wire through the plurality of through holes, and the plurality of through holes penetrate through the first insulating layer, the second insulating layer, and the third insulating layer.

In some embodiments, a fourth insulating layer disposed between the second gate metal layer and the third insulating layer; and a second conductive layer disposed between the fourth insulating layer and the third insulating layer. The plurality of through holes include a plurality of first through holes and a plurality of second through holes, the plurality of first through holes penetrates through the first insulating layer, the second insulating layer, and the fourth insulating layer, and the plurality of second through holes penetrates through the third insulating layer; wherein the plurality of first through holes are communicated with the plurality of second through holes, and a diameter of each of the plurality of second through holes is greater than a diameter of each of the plurality of first through holes.

The present invention further provides a display device including the above-mentioned display panel.

In the display panel and the display device provided by embodiments of the present invention, the plurality of shielding blocks of the shielding layer shield the plurality of thin-film transistors of the pixel driving circuit layer. The plurality of power supply lines and the converging wire of the shielding layer are electrically connected to each other through the plurality of through holes. The converging wires between the adjacent through holes are arranged according to the shortest distance between the adjacent through holes, so that an expected current path flowing through the converging wire is within a boundary of the converging wire and is conducted along the shortest distance between the adjacent through holes. Therefore, an accumulation of charges at a boundary of the shielding layer can be reduce, and an occurrence of an effect of ESD damage of the shielding layer can be reduced.

DESCRIPTION OF SPECIFIC EMBODIMENTS OF THE INVENTION

In order to make purposes, technical solutions, and effects of the present application clearer and more specific, the present application is further described in detail below with reference to the accompanying drawings and examples. It should be understood that the specific embodiments described herein are only used to explain the application, and are not used to limit the present application. In the present invention, if no explanation is made to the contrary, orientation words such as "upper" and "lower" usually refer to upper and lower directions of a device in an actual use or a working state and specifically refer to drawing directions in drawings. Also, "inner" and "outer" refer to an outline of the device.

Figure 1:
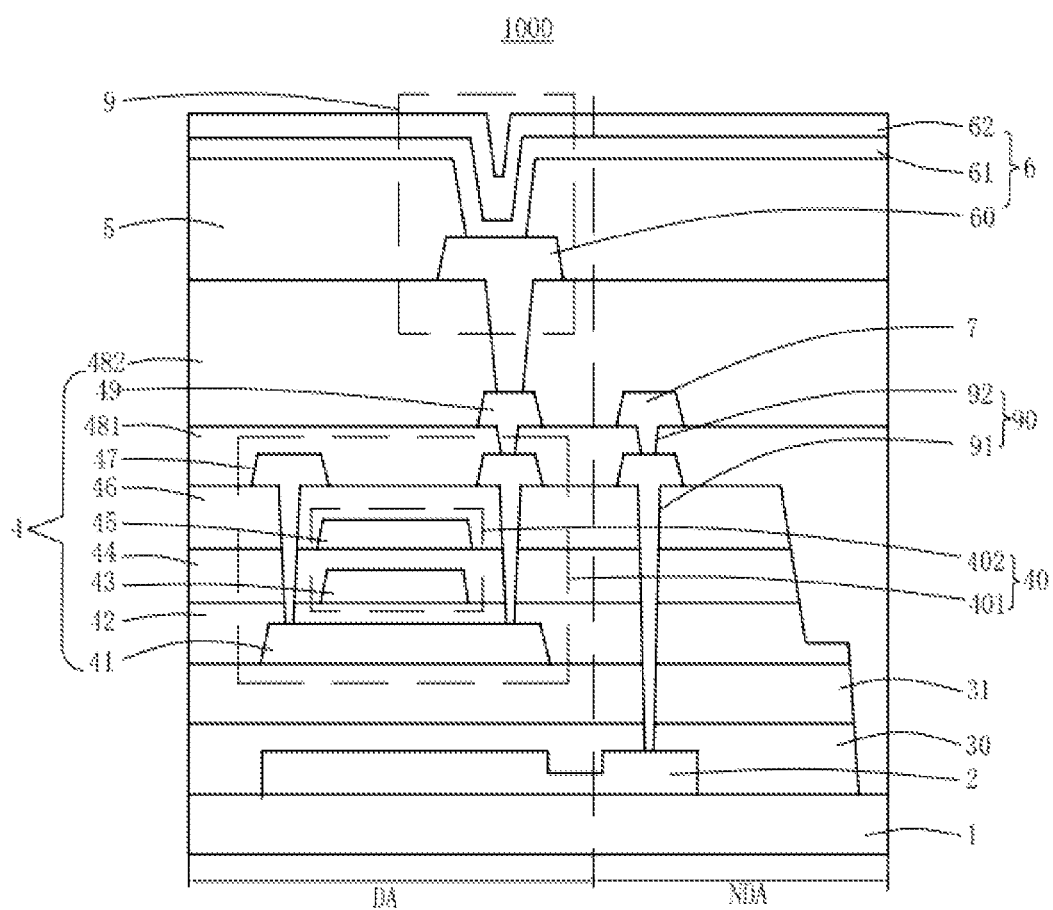
FIG. 1 is a cross-sectional schematic view of a display panel provided by an embodiment of the present invention.
Figure 2:
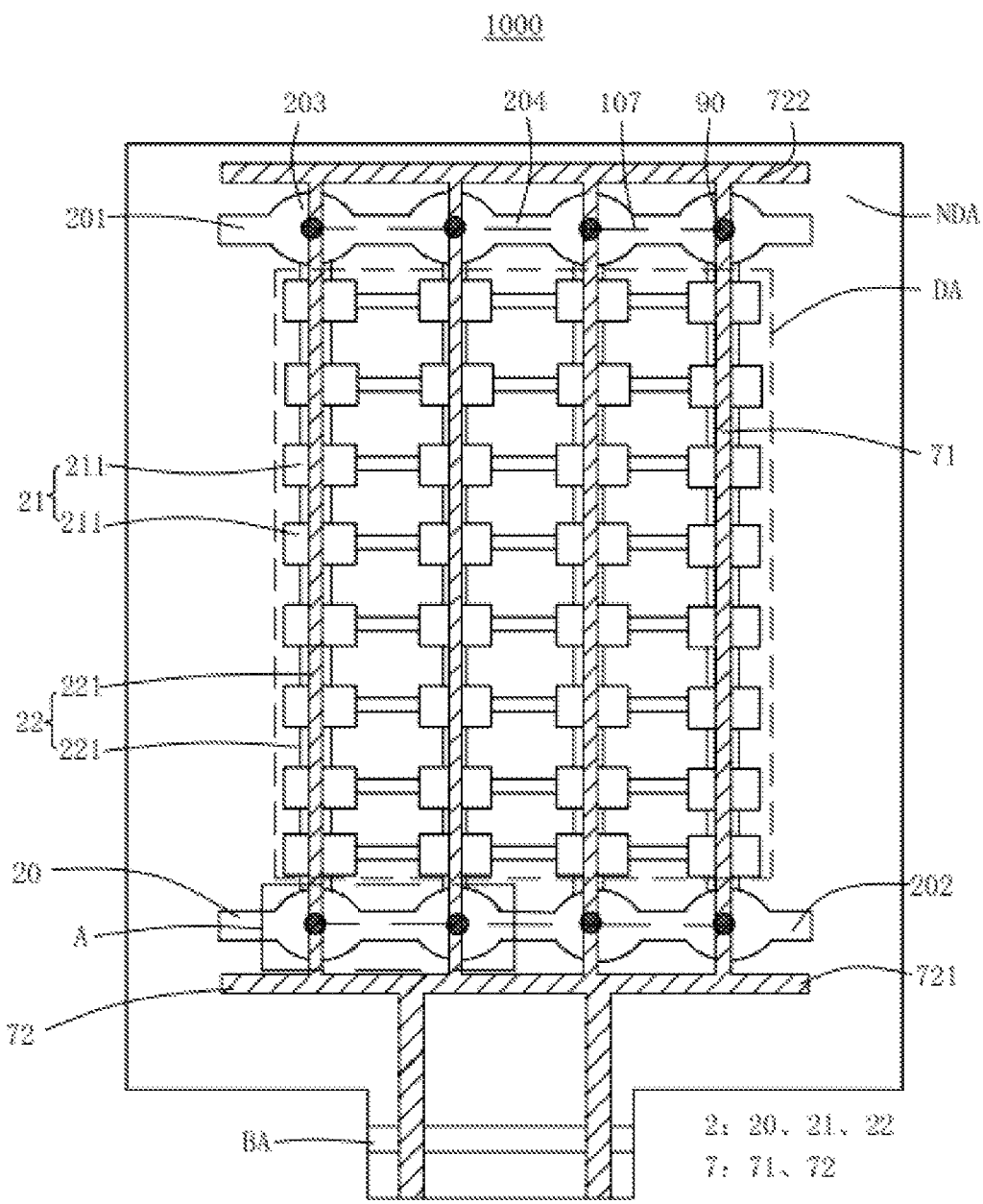
FIG. 2 is a top view of the display panel provided by an embodiment of the present invention.

As shown in FIGS. 1-2, an embodiment of the present invention provides a display panel 1000, which can be an organic light-emitting diode (OLED) display panel, a liquid crystal display panel, a micro-light-emitting diode display panel, or a mini-light-emitting diode display panel. For example, the display panel 1000 is an OLED display panel.

The display panel 1000 includes a display region DA and a non-display region NDA. The display region DA can be a region for arranging a plurality of sub-pixels 9 for displaying images. The non-display region NDA can be a driving unit, such as a gate driving circuit, for providing driving signals to a plurality of pixel driving circuits 40 of the plurality of sub-pixels 9, and some other regions for connecting the driving unit. The plurality of sub-pixels 9 are not arranged in the non-display region NDA. The non-display region NDA can be disposed on at least a side of the display region DA. The non-display region NDA can at least partially surround a periphery of the display region DA. The non-display region NDA includes a first non-display region and a second non-display region disposed on two sides of the display region DA, and the display panel 1000 is bent at a bending sub-region BA of the first non-display region.

The display panel 1000 includes a substrate 1, a shielding layer 2 located on the substrate 1, a bottom insulating layer 30 located on the shielding layer 2, a buffer layer 31 located on the bottom insulating layer 30, a pixel driving circuit layer 4 located on the buffer layer 31, a pixel definition layer 5 and a light-emitting device layer 6 located on the pixel driving circuit layer 4, and a plurality of power supply lines 7. For convenience of description, the plurality of sub-pixels 9 can include the light-emitting device layer 6.

Referring to FIG. 1, the substrate 1 can include a single-layer insulating material such as glass, quartz, and polymer resin, or a multi-layer insulating material such as double-layer polymer resin. The substrate 1 can be a rigid substrate 1 or a flexible substrate 1. The substrate 1 is used to carry film layers disposed thereon.

The bottom insulating layer 30 and the buffer layer 31 can include a single-layer film that is an insulating film such as silicon nitride ($SiN_x$) and silicon oxide ($SiO_x$) or multi-layer films laminated with silicon nitride ($SiN_x$) and silicon oxide ($SiO_x$). The buffer layer 31 prevents penetration of unnecessary components such as impurities or moisture.

Referring to FIGS. 1-2, the shielding layer 2 can include single-layer or multi-layer metal materials such as Mo, Ti, Ti/Al/Ti, semiconductor materials Si, transparent conductive materials, e.g., indium tin oxide (ITO). The shielding layer 2 is located between the bottom insulating layer 30 and the substrate 1, and is disposed under the pixel driving circuit layer 4 to shield the plurality of pixel driving circuits 40 of the pixel driving circuit layer 4. The shielding layer 2 includes a converging wire 20, a plurality of shielding portions 21, and a plurality of common connection portions 22. The converging wire 20 is located in the non-display region NDA and adjacent to the display region DA, and the plurality of shielding portions 21 are located in the display region DA.

The converging wire 20 includes a first converging wire 201 and a second converging wire 202. The first converging wire 201 is located in the first non-display region, and the second converging wire 202 is located in the second non-display region, the first converging wire 201 and the second converging wire 202 extend along a first direction, and the first direction is an extending direction of a plurality of scan lines of the pixel driving circuit layer 4 (from left to right in the figure). The first converging wire 201 and the second converging wire 202 each include a plurality of first connection sections 203 and a plurality of second connection sections 204. A periphery of each of the plurality of first connection sections 203 is arc shaped. For example, the plurality of peripheries of the plurality of first connection sections 203 can be approximately oval or circular, and the plurality of second connection section 204 are approximately linear. Each of the plurality of second connection sections 204 is connected between a middle portion of two adjacent ones of the plurality of first connection sections 203, and a maximum width of the plurality of first connection sections 203 is greater than a width of the plurality of second connection sections 204.

The plurality of shielding portions 21 are used to shield a plurality of thin-film transistors 401 of the plurality of pixel driving circuits 40 arranged in an array along the first direction and a second direction. The plurality of thin-film transistors 401 include a plurality of driving thin-film transistors, and the plurality of shielding portions 21 include a plurality of shielding blocks 211 for shielding a plurality of semiconductor patterns of the plurality of driving thin-film transistors. The plurality of shielding blocks 211 are arranged in an array, and each column of the plurality of shielding blocks 211 shield the plurality of semiconductor patterns of the plurality of driving thin-film transistors of the plurality of pixel driving circuits 40 that drive a corresponding column of the plurality of sub-pixels 9, and are connected to a corresponding one of the plurality of first connection sections 203.

The plurality of common connection portions 22 include a plurality of common connection sections 221. The first converging wire 201 is directly connected between outermost of the plurality of shielding blocks 211 on a vertical direction respectively through the plurality of common connection sections 221, the plurality of common connection sections 221 are electrically connected between the plurality of shielding blocks 211.

Referring further to FIG. 1, the pixel driving circuit layer 4 includes a semiconductor layer 41, a first insulating layer 42 located on the semiconductor layer 41, a first gate metal layer 43 located on the first insulating layer 42, a first gate metal layer 43 located on the first insulating layer 42, a second insulating layer 44 located on the first gate metal layer 43, a second gate metal layer 45 located on the second insulating layer 44, an interlayer insulating layer 46 (i.e., a fourth insulating layer) located on the second gate metal layer 45, a third metal layer 47 (i.e., a second conductive metal layer) located on the interlayer insulating layer 46, a first planarization layer 481 (i.e., a third insulating layer) located on the third metal layer 47, a fourth metal layer 49 (i.e., a first conductive layer) located on the first planarization layer 481, and a second planarization layer 482 located on the fourth metal layer 49. The semiconductor layer 41, the first insulating layer 42, the first gate metal layer 43, the interlayer insulating layer 46, and the third metal layer 47 can jointly form the plurality of thin-film transistors 401. The first gate metal layer 43, the second insulating layer 44, and the second gate metal layer 45 can jointly form a plurality of capacitors 402. The plurality of pixel driving circuits 40 can include the plurality of capacitors 402 and the plurality of thin-film transistors 401 to drive the plurality of sub-pixels 9 to emit light.

The semiconductor layer 41 can include polysilicon or oxide semiconductor. Here, the oxide semiconductor can include any one of oxides or composite oxides of titanium (Ti), hafnium (Hf), zirconium (Zr), aluminum (Al), tantalum (Ta), germanium (Ge), zinc (Zn), gallium (Ga), tin (Sn), or indium (In). The semiconductor layer 41 can include the plurality of semiconductor patterns of the plurality of thin-film transistors 401. The plurality of semiconductor patterns can include: a channel region overlapping a gate in a thickness direction and a first source/drain region and a second source/drain region located on a side and another side of the channel region, respectively. The first source/drain region and the second source/drain region are conductive regions, and can have higher conductivity and lower resistance than the channel region.

The first insulating layer 42 and the second insulating layer 44 can be a single-layer film including silicon oxide ($SiO_x$) or silicon nitride ($SiN_x$), or a multi-layer film laminated with silicon oxide ($SiO_x$) or silicon nitride ($SiN_x$).

The first gate metal layer 43 can include a plurality of gates of the plurality of thin-film transistors 401 and the plurality of scan lines, and the plurality of gates can be formed by a low-resistance material. The second gate metal layer 45 can include an upper electrode plate of the plurality of capacitors 402, and the plurality of gates can serve as a lower electrode plate of the plurality of capacitors 402. Materials of the first gate metal layer 43 and the second gate metal layer 45 can be the same or different. For example, the first gate metal layer 43 and the second gate metal layer 45 can include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), but not limited thereto.

The interlayer insulating layer 46 can include silicon compounds, metal oxides, etc. For example, the interlayer insulating layer 46 can include silicon oxide, silicon nitride, silicon oxynitride, aluminum oxide, tantalum oxide, hafnium oxide, zirconium oxide, titanium oxide, etc. These materials can be used alone or in combination with one another.

The third metal layer 47 can include a plurality of sources and a plurality of drains of the plurality of thin-film transistors 401 and a plurality of data lines. Materials of the third metal layer 47 and the fourth metal layer 49 can be the same. For example, the third metal layer 47 and the fourth metal layer 49 can include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third metal layer 47 can be a single-layer film or a multi-layer film. For example, the third metal layer 47 can be formed in a laminated structure of Ti/Al/Ti, Mo/Al/Mo, Mo/AlGe/Mo, Ti/Cu, etc.

Materials of the first planarization layer 481 and the second planarization layer 482 can be the same or different. For example, the first planarization layer 481 and the second planarization layer 482 can include inorganic insulating materials or organic insulating materials such as polyacrylate resin, epoxy resin, phenolic resin, polyamide resin, polyimide resin, unsaturated polyester resin, polyphenylene ether resin, polyphenylene sulfide resin, or benzocyclobutene. The first planarization layer 481 can further include a photosensitive material, but not limited thereto.

Figure 3:
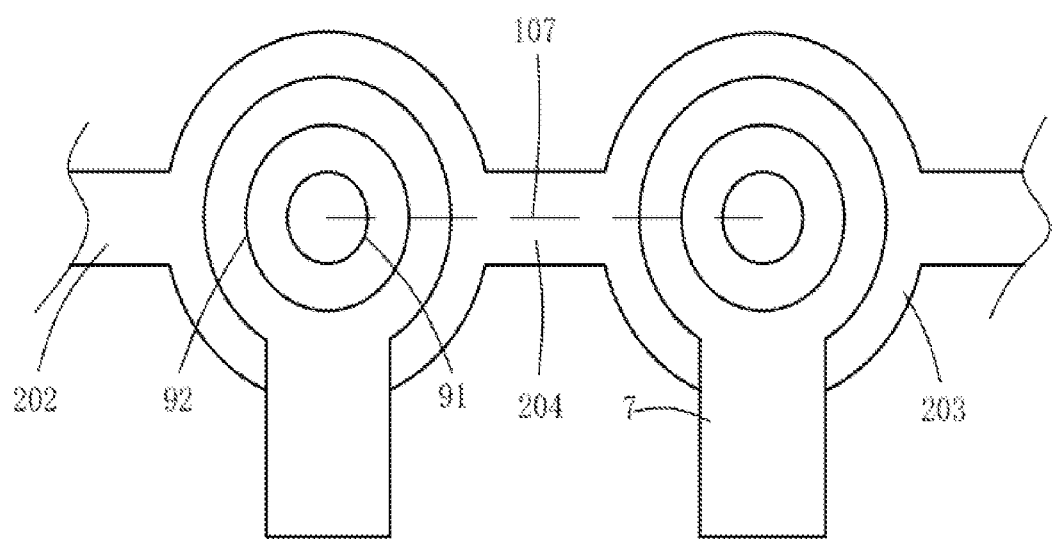
FIG. 3 is an enlarged schematic view of a portion A in FIG. 2.

Referring further to FIGS. 1-3, the plurality of power supply lines 7 are disposed in the fourth metal layer 49, and the plurality of power supply lines 7 can each be a power supply line with a fixed potential located in the non-display region NDA. The plurality of power supply lines 7 include a plurality of signal wires 71 disposed in the display region DA and electrically connected to the plurality of pixel driving circuits 40, and a plurality of peripheral wires 72 disposed in the non-display region NDA and electrically connected to a preset voltage source (e.g., a power supply chip). The plurality of peripheral wires 72 are electrically connected to the plurality of signal wires 71, so as to reduce a signal difference on the plurality of signal wires 71. The plurality of signal wires 71 extend along the second direction, and the second direction is the extending direction of the plurality of data lines of the pixel driving circuit layer 4 (a direction from top to bottom in the figure). The plurality of peripheral wires 72 extend along the first direction, and include a plurality of first connection portions 721 and a plurality of second connection portions 722 opposite to each other. The plurality of first connection portions 721 are adjacent to the bending sub-area BA, and the plurality of second connection portions 722 are located in the second non-display region.

For example, the plurality of power supply lines 7 are at least one of a high-voltage power supply line and a reset signal line. The third metal layer 47 and the fourth metal layer 49 can form the high-voltage power supply line, the low-voltage power supply line, and the reset signal line. The plurality of driving thin-film transistors in the plurality of thin-film transistors 401 can be connected in series with a plurality of light-emitting layers 61 of the sub-pixels 9 in a circuit loop formed by the high-voltage power supply line and the low-voltage power supply line to drive the plurality of light-emitting layers 61 of the plurality of sub-pixels 9 to emit light. The reset signal line can be used to be electrically connected to at least one of the plurality of capacitors 402, a first electrode of the plurality of sub-pixels 9, and the plurality of driving thin-film transistors for resetting.

The plurality of power supply lines 7 are electrically connected to the plurality of first connection sections 203 of the converging wire 20 through a plurality of through holes 90 to be electrically connected to the shielding layer 2. The converging wire 20 between adjacent ones of the plurality of through holes 90 is arranged according to a shortest distance between the adjacent through holes 90. Since the shortest distance between the adjacent through holes 90, i.e., a virtual line segment 107, can represent an expected current path between the adjacent through holes 90, the expected current path that is approximately linear can be located within a boundary of the converging wire 20. The plurality of through holes 90 penetrate through the first insulating layer 42, the second insulating layer 44, and the first planarization layer 481. The plurality of through holes 90 include a plurality of first through holes 91 and a plurality of second through holes 92. The plurality of first through holes 91 penetrate through the first insulating layer 42, the second insulating layer 44, and the interlayer insulating layer 46. The plurality of second through holes 92 penetrate through the first planarization layer 481. The plurality of first through holes 91 are communicated with the plurality of second through holes 92, and a diameter of each of the plurality of first through holes 91 is smaller than a diameter of each of the plurality of second through holes 92.

Reference is further made to FIG. 1. The pixel definition layer 5 can include resins such as polyacrylates or polyimides, inorganic materials such as silica related, etc. The pixel definition layer 5 is formed with a plurality of openings to expose a first electrode 60 of a light emitting device layer 6.

The light emitting device layer 6 can include the first electrode 60, the light emitting layer 61, and a second electrode 62.

The first electrode 60 can be an anode. The anode can be materials having a higher work function, such as laminated indium tin oxide (ITO), indium zinc oxide (IZO), zinc oxide (ZnO), and indium oxide ($In_2O_3$), and materials such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a laminated film structure of reflective material layers of a mixture thereof, but not limited thereto. A layer with a higher work function can be arranged on an upper layer more adjacent to the light emitting layer 61 than the reflective material layer. The anode can have a multi-layer structure having ITO/Mg, ITO/$MgF_2$, ITO/Ag, and ITO/Ag/ITO, but not limited thereto.

The light emitting layer 61 can include an organic material layer. The organic material layer of the light-emitting layer 61 can include an organic light-emitting layer, and can further include a hole injection/transmission layer and/or an electron injection/transmission layer.

The second electrode 62 can be a cathode. The cathode can include materials such as Li, Ca, LiF/Ca, LiF/Al, Al, Mg, Ag, Pt, Pd, Ni, Au, Nd, Ir, Cr, $BaF_2$, Ba, or a material layer of compounds or mixtures thereof (e.g., an Ag and Mg mixture, etc.) with a lower work function. The cathode can further include a transparent metal oxide layer disposed on the material layer with a lower work function.

In the display panel 1000 of the present embodiment, the plurality of shielding blocks 211 of the shielding layer 2 shield the plurality of thin-film transistors 401 of the pixel driving circuit layer 4, the plurality of power supply lines 7, and the converging wire 20 of the shielding layer 2 are electrically connected to each other through the plurality of through holes 90 disposed in the pixel driving circuit layer 4. The converging wire 20 between the adjacent through holes 90 is arranged according to the shortest distance between the adjacent through holes 90, so that the expected current path flowing through the converging wire 20 is within the boundary of the converging wire 20 and is conducted along the shortest distance between the adjacent through holes 90. Therefore, an accumulation of charges at a boundary of the shielding layer 2 can be reduce, and an occurrence of an effect of electro-static discharge (ESD) damage of the shielding layer 2 can be reduced.

Figure 4:
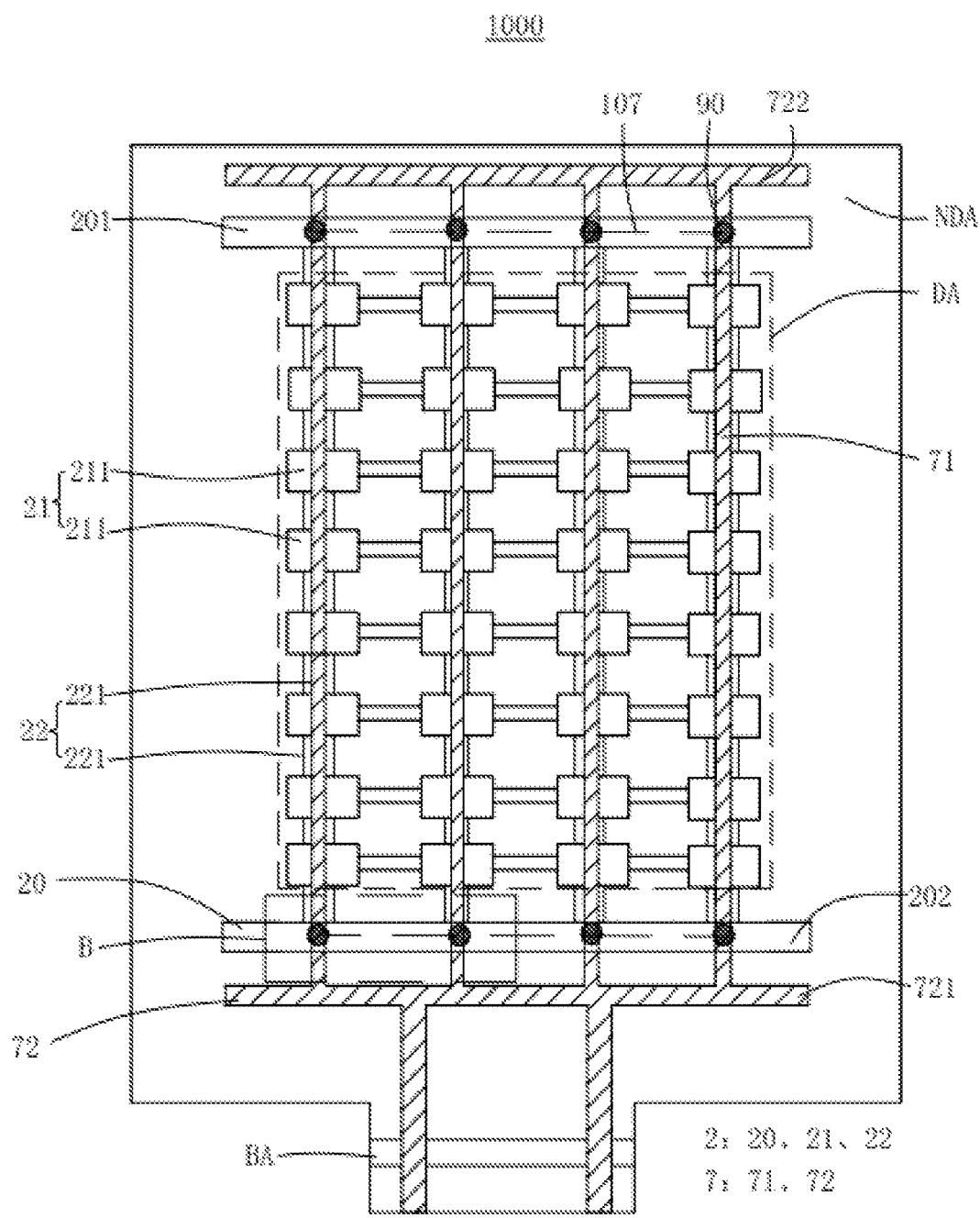
FIG. 4 is a top view of a display panel provided by another embodiment of the present invention.
Figure 5:
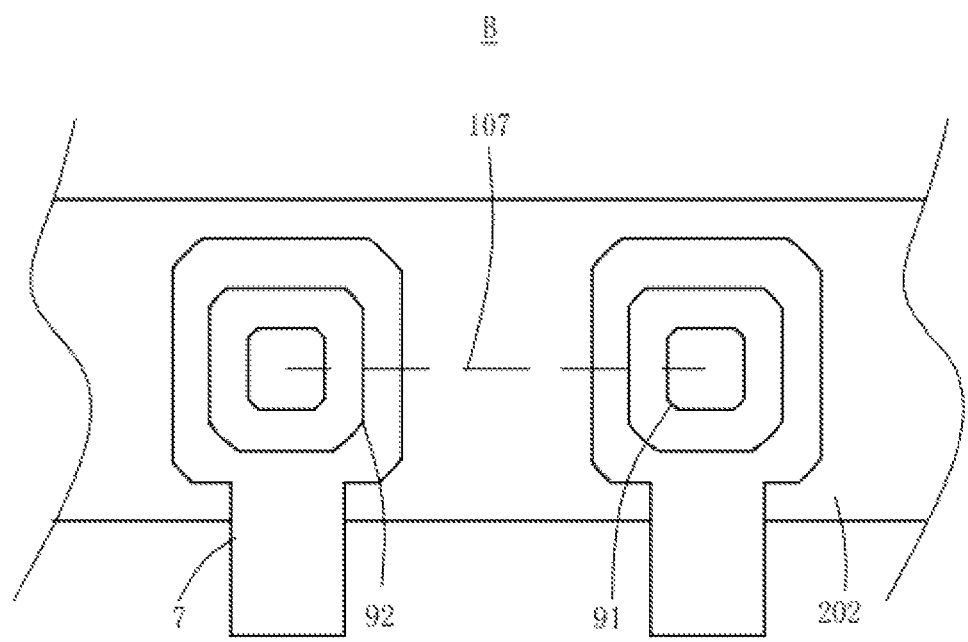
FIG. 5 is an enlarged schematic view of a portion B in FIG. 4.

In other embodiments, referring to FIGS. 4-5, the first converging wire 201 and the second converging wire 202 are linear, and the plurality of through holes 90 overlapping the first converging wire 201 and the second converging wire 202 are linear in arrangement. Based on a same or a similar principle, the effect of ESD damage occurring at adjacent joint locations can be reduced.

In other embodiments, the shielding layer 2 can be located between the buffer layer 31 and the semiconductor layer 41, or can be located under the substrate 1, so as to be located under the pixel driving circuit layer 4 for shielding.

In other embodiments, the plurality of power supply lines 7 can also be located in other layers of the pixel driving circuit layer 4, or can be located under the pixel driving circuit layer 4, and are not limited to a high-voltage power supply line or a reset signal line.

The present invention further provides a display device including the display panel 1000 described in any of the above. The display device serves as a device for displaying video or still images, and can be not only fixed terminals such as televisions, desktop computers, monitors, billboards, but also mobile terminals such as mobile phones, tablet computers, mobile communication terminals, electronic notepads, E-books, multimedia players, navigators, laptops, and also wearable electronic devices such as smart watches, smart glasses, virtual reality devices, and augmented reality devices.

It can be understood that those having ordinary skills of the art may easily contemplate various changes and modifications of the technical solution and technical ideas of the present application and all these changes and modifications are considered within the protection scope of right for the present application.

What is claimed is:

1. A display panel, comprising a display region and a non-display region disposed on at least one side of the display region, wherein the display panel comprises:
   a substrate;
   a shielding layer located on the substrate, wherein the shielding layer comprises a plurality of shielding blocks and a converging wire electrically connected to the plurality of shielding blocks, and the converging wire is located on at least one side of the plurality of shielding blocks;

a pixel driving circuit layer located on the shielding layer, wherein the pixel driving circuit layer comprises a plurality of pixel driving circuits located in the display region, each of the plurality of pixel driving circuits at least partially overlaps a corresponding one of the shielding blocks; and a plurality of power supply lines disposed on a side of the shielding layer away from the substrate, wherein the plurality of power supply lines are electrically connected to the converging wire through a plurality of through holes;

wherein the converging wire between two adjacent ones of the plurality of through holes is disposed according to a shortest distance between the two adjacent through holes.

2. The display panel according to claim 1, wherein the converging wire between the two adjacent through holes is linear in arrangement.

3. The display panel according to claim 2, wherein the converging wire is linear in arrangement and the plurality of through holes overlappingly disposed on the converging wire are linear in arrangement.

4. The display panel according to claim 1, wherein the converging wire comprises a first converging wire, and the first converging wire comprises a plurality of first connection sections and a plurality of second connection sections; wherein each of the plurality of second connection sections is connected between a middle portion of two adjacent first plurality of connection sections, a width of each of the plurality of first connection sections is greater than a width of each of the plurality of second connection sections, and the plurality of power supply lines are electrically connected to the plurality of first connection sections through the plurality of through holes.

5. The display panel according to claim 4, wherein the plurality of pixel driving circuits are arranged in an array in a first direction and a second direction, each of the plurality of first connection sections is electrically connected to the plurality of shielding blocks corresponding to a column of the plurality of pixel driving circuits arranged along a first direction.

6. The display panel according to claim 5, wherein a periphery of each of the plurality of first sections is arc shaped, the plurality of second sections are linearly shaped, a maximum width of each of the plurality of first sections is greater than the width of each of the plurality of second sections.

7. The display panel according to claim 1, wherein the non-display region comprises: a first non-display region and a second non-display region disposed on two sides of the display region, wherein the first non-display region comprises a bending sub-region, and the display panel bends at the bending sub-region; and the converging wire comprises a first converging wire arranged in the first non-display region, and the plurality of power supply lines are electrically connected to the plurality of first connection sections at least through the plurality of through holes.

8. The display panel according to claim 7, wherein the converging wire comprises a second converging wire arranged in the second non-display region, and the plurality of power supply lines are electrically connected to the plurality of second connection sections through the plurality of through holes.

9. The display panel according to claim 1, wherein the pixel driving circuit layer comprises:

a semiconductor layer disposed on a side of the shielding layer away from the substrate;

a first insulating layer disposed on a side of the semiconductor layer away from the substrate;

a first gate metal layer disposed on a side of the first insulating layer away from the substrate;

a second insulating layer disposed on a side of the first gate metal layer away from the substrate;

a second gate metal layer disposed on a side of the second insulating layer away from the substrate; and a third insulating layer disposed on a side of the second gate metal layer away from the substrate;

wherein the first conductive layer is disposed on a side of the third insulating layer away from the substrate, the plurality of power supply lines of the first conductive layer are electrically connected to the converging wire through the plurality of through holes, and the plurality of through holes penetrate through the first insulating layer, the second insulating layer, and the third insulating layer.

10. The display panel according to claim 9, wherein the pixel driving circuit layer further comprises:

a fourth insulating layer disposed between the second gate metal layer and the third insulating layer; and a second conductive layer disposed between the fourth insulating layer and the third insulating layer;

wherein the plurality of through holes comprise a plurality of first through holes and a plurality of second through holes, the plurality of first through holes penetrates through the first insulating layer, the second insulating layer, and the fourth insulating layer, and the plurality of second through holes penetrates through the third insulating layer; wherein the plurality of first through holes are communicated with the plurality of second through holes, and a diameter of each of the plurality of second through holes is greater than a diameter of each of the plurality of first through holes.

11. A display device comprising the display panel as claimed in claim 1, wherein the display panel is an organic light-emitting diode (OLED) panel.

12. The display device according to claim 11, wherein the converging wire between the two adjacent through holes is linear in arrangement.

13. The display device according to claim 12, wherein the converging wire is linear in arrangement and the plurality of through holes overlappingly disposed on the converging wire are linear in arrangement.

14. The display device according to claim 11, wherein the converging wire comprises a first converging wire, and the first converging wire comprises a plurality of first connection sections and a plurality of second connection sections; wherein each of the plurality of second connection sections is connected between a middle portion of two adjacent first plurality of connection sections, a width of each of the plurality of first connection sections is greater than a width of each of the plurality of second connection sections, and the plurality of power supply lines are electrically connected to the plurality of first connection sections through the plurality of through holes.

15. The display device according to claim 14, wherein the plurality of pixel driving circuits are arranged in an array in a first direction and a second direction, each of the plurality of first connection sections is electrically connected to the plurality of shielding blocks corresponding to a column of the plurality of pixel driving circuits arranged along a first direction.

16. The display device according to claim 15, wherein a periphery of each of the plurality of first sections is arc shaped, the plurality of second sections are linearly shaped, a maximum width of each of the plurality of first sections is greater than the width of each of the plurality of second sections.

17. The display device according to claim 11, wherein the non-display region comprises: a first non-display region and a second non-display region disposed on two sides of the display region, wherein the first non-display region comprises a bending sub-region, and the display panel bends at the bending sub-region; and the converging wire comprises a first converging wire arranged in the first non-display region, and the plurality of power supply lines are electrically connected to the plurality of first connection sections at least through the plurality of through holes.

18. The display device according to claim 17, wherein the converging wire comprises a second converging wire arranged in the second non-display region, and the plurality of power supply lines are electrically connected to the plurality of second connection sections through the plurality of through holes.

19. The display device according to claim 11, wherein the pixel driving circuit layer comprises:
    a semiconductor layer disposed on a side of the shielding layer away from the substrate;
    a first insulating layer disposed on a side of the semiconductor layer away from the substrate;
    a first gate metal layer disposed on a side of the first insulating layer away from the substrate;
    a second insulating layer disposed on a side of the first gate metal layer away from the substrate;
    a second gate metal layer disposed on a side of the second insulating layer away from the substrate; and
    a third insulating layer disposed on a side of the second gate metal layer away from the substrate;
    wherein the first conductive layer is disposed on a side of the third insulating layer away from the substrate, the plurality of power supply lines of the first conductive layer are electrically connected to the converging wire through the plurality of through holes, and the plurality of through holes penetrate through the first insulating layer, the second insulating layer, and the third insulating layer.

20. The display device according to claim 19, wherein the pixel driving circuit layer further comprises:
    a fourth insulating layer disposed between the second gate metal layer and the third insulating layer; and
    a second conductive layer disposed between the fourth insulating layer and the third insulating layer;
    wherein the plurality of through holes comprise a plurality of first through holes and a plurality of second through holes, the plurality of first through holes penetrates through the first insulating layer, the second insulating layer, and the fourth insulating layer, and the plurality of second through holes penetrates through the third insulating layer; wherein the plurality of first through holes are communicated with the plurality of second through holes, and a diameter of each of the plurality of second through holes is greater than a diameter of each of the plurality of first through holes.

* * * * *